(12) United States Patent
Lau

(10) Patent No.: US 7,338,841 B2  
(45) Date of Patent: Mar. 4, 2008

(54) LEADFRAME WITH ENCAPSULANT GUIDE AND METHOD FOR THE FABRICATION THEREOF

(75) Inventor: Keng Kiat Lau, Singapore (SG)

(73) Assignee: Stats Chippac Ltd., Singapore (SG)

( * ) Notice: Subject to any disclaimer, the term of this patent is extended or adjusted under 35 U.S.C. 154(b) by 355 days.

(21) Appl. No.: 10/907,758

(22) Filed: Apr. 14, 2005

(65) Prior Publication Data

US 2006/0234426 A1    Oct. 19, 2006

(51) Int. Cl.
- H01L 21/50 (2006.01)
- H01L 21/48 (2006.01)
- H01L 21/44 (2006.01)
- H01L 23/495 (2006.01)
- H01L 23/498 (2006.01)

(52) U.S. Cl. ............ 438/124; 438/123; 438/106; 438/127; 257/676; 257/666; 257/E23.031; 257/E23.061; 257/E23.046; 257/E23.043

(58) Field of Classification Search ........ 438/106, 438/121, 123–124; 257/666, 676, E23.031, 257/E23.061, E23.046, E23.043  
See application file for complete search history.

(56) References Cited

U.S. PATENT DOCUMENTS

| 5,239,131 | A | 8/1993 | Hoffman et al. | 174/52.4 |
| 5,939,775 | A | 8/1999 | Bucci et al. | 257/667 |
| 6,424,024 | B1 | 7/2002 | Shih et al. | 257/667 |
| 6,448,633 | B1* | 9/2002 | Yee et al. | 257/666 |
| 6,627,976 | B1* | 9/2003 | Chung et al. | 257/666 |
| 6,800,507 | B2* | 10/2004 | Kasuga et al. | 438/112 |
| 6,847,099 | B1* | 1/2005 | Bancod et al. | 257/666 |
| 6,894,376 | B1* | 5/2005 | Mostafazadeh et al. | 257/684 |

* cited by examiner

Primary Examiner—Luan Thai  
(74) Attorney, Agent, or Firm—Mikio Ishimaru

(57) ABSTRACT

A method for fabricating a leadframe with encapsulant guide is provided, including forming a die attach paddle. Leads are formed around at least portions of the die attach paddle, and encapsulant guides are formed angled on a plurality of the leads to push the leads outwardly when an encapsulant flows therepast.

20 Claims, 3 Drawing Sheets

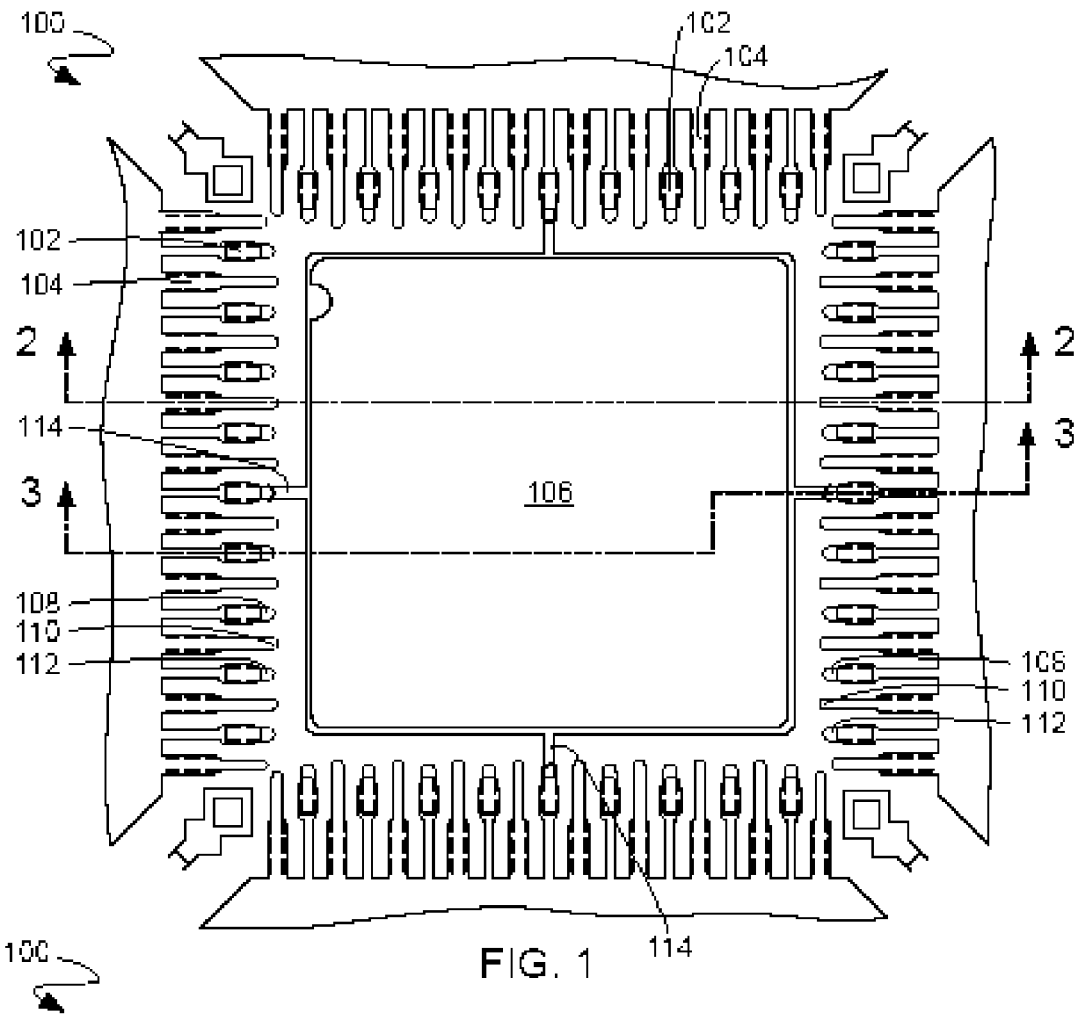
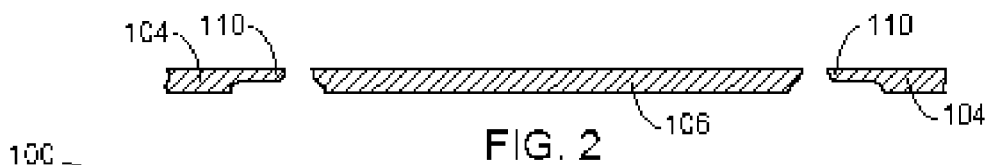
FIG. 2
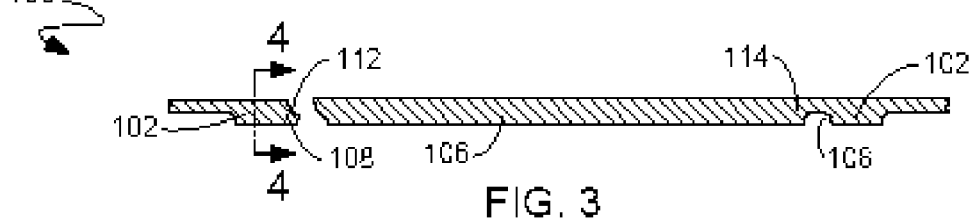
FIG. 3
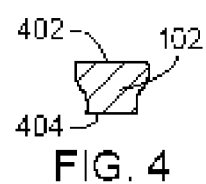
FIG. 4

LEADFRAME WITH ENCAPSULANT GUIDE AND METHOD FOR THE FABRICATION THEREOF

TECHNICAL FIELD

The present invention relates generally to integrated circuits, and more particularly to leadframes for integrated circuits and methods for fabrication of such leadframes.

BACKGROUND ART

Reducing the size of electronic devices while increasing performance and speed is a continuing objective in the electronics industry. Electronic system manufacturers continue to demand components with higher performance and reliability along with reduced physical sizes and manufacturing costs. To accomplish this, increased miniaturization of integrated circuit ("IC") packages is becoming increasingly essential. In response, modern requirements for semiconductor packaging are increasingly oriented toward smaller and thinner packages having ever higher numbers of input/output ("I/O") terminals.

IC packages for complex electronic systems typically incorporate one or more interconnected IC chips or dies, which are usually made from a semiconductor material such as silicon ("Si") or gallium arsenide ("GaAs"). A variety of semiconductor devices may be formed in various layers on IC chips using photolithographic techniques. After manufacture, the IC chips are typically incorporated into packages that are then mounted on printed circuit boards.

IC chip packages typically have numerous external pins that are mechanically attached to conductor patterns on the printed circuit boards by soldering or other known techniques. Typically, the packages in which these IC chips are mounted include a substrate or other chip-mounting device. One example of such a substrate is a leadframe. High-performance leadframes may encompass multi-layer structures including power, ground, and signal layers on separate planes.

IC chips may be attached to a leadframe by use of an adhesive, or by other commonly employed techniques such as soldering. A number of power, ground, and/or signal leads is then attached to power, ground, and/or signal sites on the IC chip.

Once an IC chip is attached mechanically and electrically to the leadframe, the leadframe may be enclosed or encapsulated in a protective enclosure such as plastic, or a multi-part housing made of plastic, ceramic, or metal. The enclosure helps to protect the leadframe and the attached IC chip from physical, electrical, moisture, and/or chemical damage.

The leadframe and attached chip may then be mounted, for example, on a circuit board or circuit card, typically with other leadframes or devices, for incorporation into any of a wide variety of end products.

Typical known leadframes that include a number of layers on different planes are complex and expensive to produce. Multiple planes have nevertheless been incorporated into the design of many leadframes in order to accommodate the high density of leads needed for the highly complex IC chips typically used today.

Another solution for providing a high density of leads is a multiple-row leadframe in which independent inner and outer rows of leads are provided in a common plane. One such configuration, for example, provides a dual-row pattern in which an inner row of leads is surrounded by an outer row, either in staggered or in-line configurations.

"Leadless" packages are becoming increasingly important as component and circuit designs become ever smaller and smaller. In such leadless packages, the internal leads of the leadframe terminate as contacts on the exterior surface of the package rather than as external wires or leads extending outwardly from the package surface. In this manner, some of the contacts, for example those coming from the internal inner row leads, can be located on the package surface inwardly and away from the package edge. This positions the inner row contacts away from other contacts that are on the package edge (such as, for example, contacts from the outer row leads). More contacts can thus be accommodated without requiring a larger and longer package edge, since not all the contacts are crowded together just at and along the package edge.

One such leadles package is a equal flat no lead ("QFN") package. QFN packages with higher numbers of input and output ("I/O") connections in the same (or smaller) body sizes are increasingly important for successful and competitive end-product designs. One key factor that is helping to achieve the higher number of I/Os in such compact end-product designs is a dual-row internal lead arrangement incorporated into leadless QFN packages. These designs have inner row leads and outer row leads (either staggered or in-line), usually in the same plane.

Unfortunately, as the leadframe elements become smaller and smaller in such designs, they also become thinner and less robust, which makes them increasingly susceptible to displacement, such as bending or tilting, while they are being encapsulated. The supports for the inner leads, in particular, are weaker than those for the outer leads. The inner leads are therefore even more likely to be displaced in this manner by the encapsulant as the encapsulant flows over and through the leadframe during the molding process. This displacement moves the leads from their proper positions and allows the encapsulant to seep under the leads, causing mold flash underneath the pad terminals. This in turn causes the leads to be partially or completely covered with the encapsulant at the package surface, which results in a defective package.

Thus, a need remains for leadframe designs, configurations, and manufacturing methods that will maintain the leads in their proper positions during the flow of the encapsulant in the package molding process. In view of the ever-decreasing sizes of leadframes, the ever-increasing numbers of leads on such leadframes, and the persistent need to reduce costs and increase efficiencies, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method for fabricating a leadframe with encapsulant guide. A die attach paddle is formed. Leads are formed around at least portions of the die attach paddle, and encapsulant guides are formed angled on a plurality of the leads to push the leads outwardly when an encapsulant flows therepast.

Certain embodiments of the invention have other advantages in addition to or in place of those mentioned above. The advantages will become apparent to those skilled in the art from a reading of the following detailed description when taken with reference to the accompanying drawings.

BRIEF DESCRIPTION OF THE DRAWINGS

FIG. 1 is a top view, according to the present invention, of an embodiment of a leadframe having inner leads, outer leads, and a die attach paddle;

FIG. 2 is a cross-sectional view of the structure of FIG. 1, taken on line 2-2 in FIG. 1;

FIG. 3 is a cross-sectional view of the structure of FIG. 1, taken on line 3-3 in FIG. 1;

FIG. 4 is a cross-sectional view of the inner lead shown in FIG. 3, taken on line 4-4 in FIG. 3;

BEST MODE FOR CARRYING OUT THE INVENTION

Figure 5:
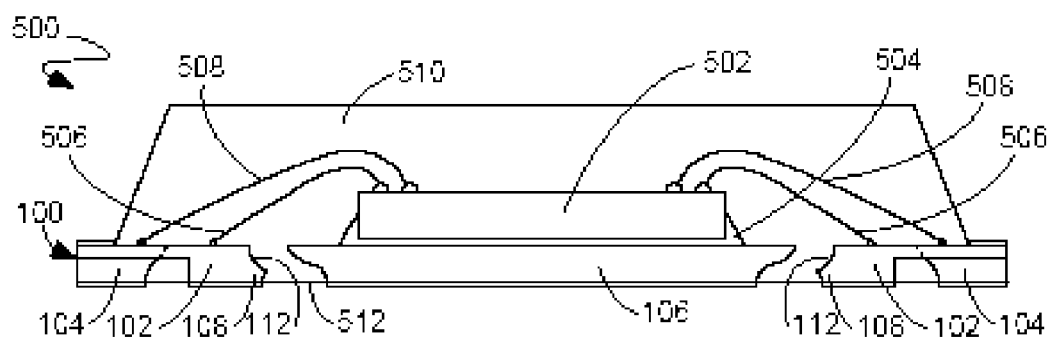
FIG. 5 is a cross-sectional view of a properly formed semiconductor package fabricated using the structure of FIG. 1.

In the following description, numerous specific details are given to provide a thorough understanding of the invention. However, it will be apparent that the invention may be practiced without these specific details. In order to avoid obscuring the present invention, some well-known configurations and process steps are not disclosed in detail. Likewise, the drawings showing embodiments of the invention are semi-diagrammatic and not to scale and, particularly, some of the dimensions are for the clarity of presentation and are shown exaggerated in the drawing FIGS. Additionally, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the leadframe, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

As leadless semiconductor packages become smaller and smaller with larger and larger contact counts, the internal leadframe leads necessarily have become thinner and weaker, posing increasing difficulties for economical and efficient fabrication of such packages.

The quad flat no lead ("QFN") package is one such leadless package. QFN packages are increasingly popular because the can readily provide higher numbers of input and output ("I/O") connections in the same (or smaller) body sizes. As a result, QFN packages are increasingly important for successful, competitive end-product designs.

One key factor contributing to higher numbers of QFN package I/Os is a dual-row internal lead arrangement having inner row leads and outer row leads (either staggered or in-line), usually in the same plane. Unfortunately, in modern compact packages such as QFN packages, the increasingly smaller and less robust leads are more and more susceptible to displacement, such as bending or tilting, as they are being encapsulated. The supports for the inner leads, in particular, are weaker than those for the outer leads. The inner leads are therefore even more likely to be displaced in this manner by the encapsulant as the encapsulant flows over and through the leadframe during the molding process. This displacement moves the leads from their proper positions and allows the encapsulant to seep under the leads, causing mold flash underneath the pad terminals. This in turn causes the leads to be partially or completely covered with the encapsulant at the package surface, resulting in a defective package.

Referring now to FIG. 1, therein is shown a top view of an embodiment of a leadframe 100 according to the present invention. The leadframe 100 has inner leads 102 and outer leads 104 arranged in respective inner and outer rows that surround a die attach paddle 106. The inner leads 102 terminate in lead tips 108, and the outer leads 104 terminate in lead tips 110. The upper faces of the lead tips 108 of the inner leads 102 are shaped, as further described below, to form encapsulant guides 112 that, in one embodiment, are integral with the inner leads 102. Tie bars 114 connect the die attach paddle 106 to the outer portions of the leadframe 100, such as, for example, by connecting respectively to several of the inner leads 102, or to the outer leads 104.

Referring now to FIG. 2, therein is shown a cross-sectional view of the leadframe 100 of FIG. 1, taken on line 2-2 therein.

Referring now to FIG. 3, therein is shown a cross-sectional view of the leadframe 100 of FIG. 1, taken on line 3-3 therein.

Referring now to FIG. 4, therein is shown a cross-sectional view of the inner lead 102 taken on line 4-4 in FIG. 3. In this embodiment, the portion of the inner lead 102 in this region is broader on the top 402 thereof than on the bottom 404 thereof.

The inner and outer lead tips 108 and 110 and the encapsulant guides 112 may be formed and shaped by etching processes, applied either to one or to both sides thereof according to the surface shapes that are to be formed. Forming the top 402 of the inner lead 102 to be broader than the bottom 404, for example by etching from the bottom side, assists in better locking the leads into the encapsulant (not shown, but see the encapsulant 510, FIG. 5) to prevent the leads from dislodging from the semiconductor package (not shown, but see the semiconductor package 500, FIG. 5).

Referring now to FIG. 5, therein is shown a cross-sectional view of a semiconductor package 500 that has been properly formed and fabricated using the leadframe 100 (FIG. 1). The thickness of the leadframe 100 in this and subsequent FIGS. is exaggerated for clarity of illustration in order to assist in understanding the invention.

During fabrication of the semiconductor package 500, a semiconductor device 502 has been suitably secured onto the die attach paddle 106, for example by means of an epoxy adhesive 504. Lead wires 506 and 508 were then connected between the semiconductor device 502 and the inner leads 102 and the outer leads 104, respectively. The leadframe 100 and the semiconductor device 502 were then encapsulated in an encapsulant 510, such as a conventional semiconductor package molding compound. The outer portions of the leadframe 100 were then removed, for example by cutting or sawing, as is known in the art, to form the final, completed semiconductor package 500.

Often, the exposed die attach paddle 106 of the semiconductor package 500 is soldered to a printed circuit board (not shown). This allows the die attach paddle 106 to provide greater heat dissipation from the semiconductor device 502 by conducting heat directly to the printed circuit board. This configuration is also often used to provide ground connections from the semiconductor package 500 to the printed circuit board.

The semiconductor package 500, incorporating the leadframe 100, is a dual-row leadless package, such as a QFN package. The package is "dual row" because there is a set of the inner leads 102 arranged in a continuous ring or inner row around the die attach paddle 106, and these are surrounded by a corresponding outer row of the outer leads 104. With this configuration of inner and outer row leads (which may be arranged in staggered or in-line configurations), a higher number of inputs/outputs ("I/Os") can be provided, in a given semiconductor package size, than can be achieved with a single row arranged around the outer periphery of the package.

The semiconductor package 500 has been correctly fabricated so that the outer leads 104, the inner leads 102, and the die attach paddle 106, are all fully exposed, co-planar, and accessible at the bottom exterior surface 512 of the semiconductor package 500. In previous prior art devices, this state of proper exposure has been difficult to achieve, particularly with respect to the inner leads 102. However, proper manufacture is facilitated and assured in the present invention by the encapsulant guides 112 of the inner leads 102.

Figure 6:
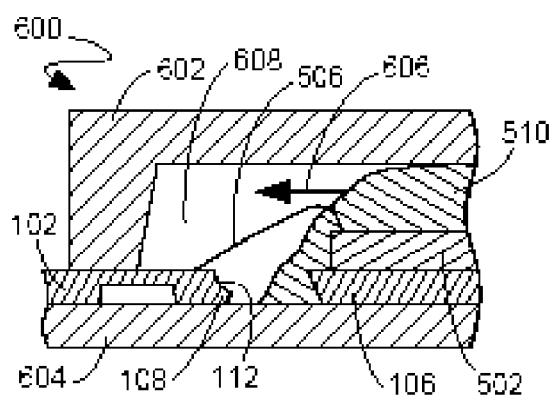
FIG. 6 is a fragmentary cross-sectional view of a semiconductor package in an intermediate stage of a molding process.

Referring now to FIG. 6, therein is shown a fragmentary cross-sectional view 600 of a semiconductor package in an intermediate stage of the molding process. The leadframe 100 with the semiconductor device 502 secured thereon is retained within an upper mold member 602 and a lower mold member 604. The encapsulant 510 flows in the direction of an arrow 606 through the mold cavity 608 within the upper mold member 602 and the lower mold member 604. During the intermediate fabrication stage shown in FIG. 6, the encapsulant 510 has almost reached the face of the encapsulant guide 112 on the inner lead 102.

It has been discovered, as taught herein, that undesirable displacement of the leadframe leads during the molding process can be prevented. This is especially advantageous with the inner leads 102, which are more vulnerable, and is accomplished, in one embodiment, by uniquely forming the encapsulant guides 112 on the lead tips 108. In particular, the faces of the encapsulant guides 112 are angled or beveled on the inner leads 102 to present an inwardly (upwardly as shown in the drawing FIGS.) facing slope relative to the direction of flow (the arrow 606) of the encapsulant 510 as it flows through the mold cavity 608. (The terms "inwardly" and "outwardly" are with reference to the interior of a semiconductor package, such as the semiconductor package 500 (FIG. 5). The term "outwardly", when describing such a lead that is adjacent a surface of such a package, means in a direction generally perpendicular to that surface as well as away from the interior of the package.) This causes the encapsulant 510 to engage and push the inner leads 102 outwardly toward the exterior of the semiconductor package that is being formed (see the semiconductor package 802 (FIG. 9)) rather than inwardly toward the interior of the semiconductor package.

It has thus been discovered that the shape of the encapsulant guides 112 on the inner leads 102 can alleviate the problem of displacement (e.g., lifting) of the inner leads 102 during molding of the encapsulant 510 as it flows therepast. The encapsulant guides 112, as described, present a face that is suitably angled relative to the direction of the flow (the arrow 606) of the encapsulant 510 during the molding process. The encapsulant guides 112 thereby prevent the lead tips 108 of the inner leads 102 from being lifted or displaced inwardly by the encapsulant 510 during the molding process. Rather, as the encapsulant 510 is driven onto and past the encapsulant guides 112, the reaction force of the encapsulant 510 thereon causes the inner leads 102 to be pressed downwardly and outwardly away from the interior of the semiconductor package that is being formed and in the direction of the bottom exterior surface thereof (e.g., the bottom exterior surface 912 shown in FIG. 9).

Figure 7:
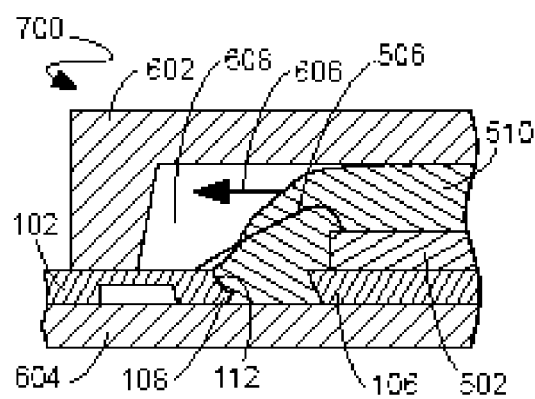
FIG. 7 is a view of the structure of FIG. 6 at a later stage of fabrication.
Figure 8:
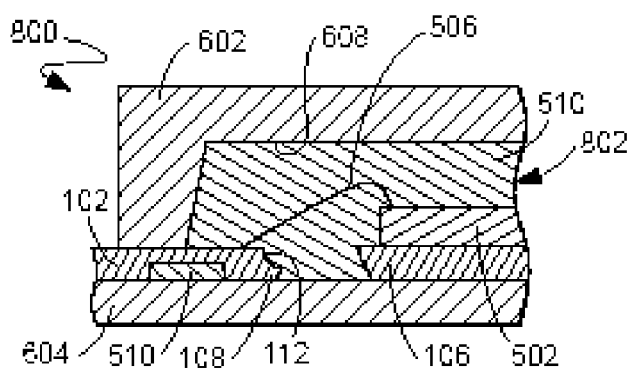
FIG. 8 is a view similar to that of FIGS. 6 and 7 after completion of the molding process.
Figure 9:
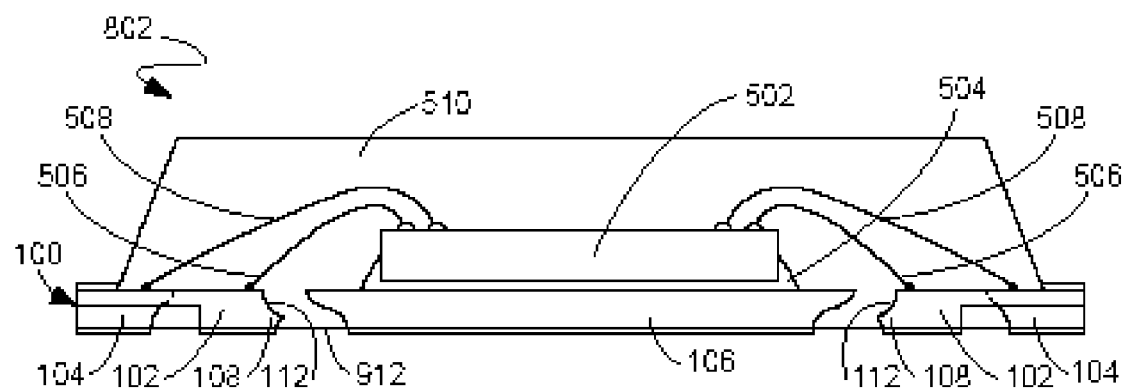
FIG. 9 is a view of a completed semiconductor package resulting from the process shown in FIGS. 6-8.

Referring now to FIG. 7, therein is shown a view 700 of the structure of FIG. 6 at a slightly later stage in the fabrication of the semiconductor package 802 (FIGS. 8 and 9). The encapsulant 510 has progressed further into the mold cavity 608 in the direction of the arrow 606, and has engaged the encapsulant guide 112 on the inner lead 102. The pressure of the encapsulant 510 as it flows against the encapsulant guide 112 has provided a downward or outward reaction force that has kept the inner lead 102 in position against the lower mold member 604, preventing the encapsulant 510 from flowing thereunder and covering part or all of the bottom of the inner lead 102 in the vicinity of the lead tip 108 thereof.

Referring now to FIG. 8, therein is shown a view 800 similar to that of FIGS. 6 and 7, after completion of the molding process by completion of the injection of the encapsulant 510 into the mold cavity 608. A semiconductor package 802 has been formed in which the lead tips 108 of the inner leads 102 have not been lifted, and consequently have not been covered on the bottom surfaces thereof with the encapsulant 510. The result is that the lead tips 108 of the inner leads 102 are fully exposed on the bottom exterior surface 912 (see FIG. 9) of the semiconductor package 802, that is, on the outer or exterior surface of the encapsulant 510.

Referring now to FIG. 9, therein is shown the semiconductor package 802 resulting from the molding process shown in FIGS. 6-8. By virtue of the encapsulant guides 112, the inner leads 102 have been protected from undesired movement during the molding of the semiconductor package 802. The inner leads 102 have remained in their proper positions, exposed on the bottom exterior surface 912 of the semiconductor package 802. The semiconductor package 802 is therefore properly formed.

Figure 10:
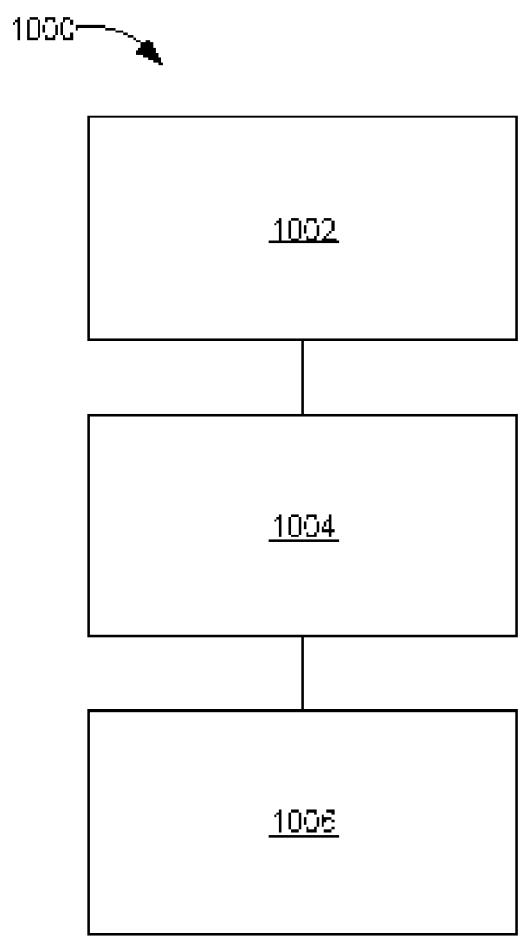
FIG. 10 is a flow chart of a method for fabricating a leadframe with encapsulant guide in accordance with an embodiment of the present invention.

Referring now to FIG. 10, therein is shown a flow chart of a method 1000 for fabricating a leadframe with encapsulant guide in accordance with an embodiment of the present invention. The method 1000 includes forming a die attach paddle in a block 1002; forming leads around at least portions of the die attach paddle in a block 1004; and forming encapsulant guides angled on a plurality of the leads to push the leads outwardly when an encapsulant flows therepast, in a block 1006.

It has been discovered that the present invention thus has numerous advantages.

An important advantage of the present invention is that it overcomes the tendency of prior art designs to cause the encapsulant to lift the fingers up or inwardly into the package, causing mold flash therebeneath.

A major advantage is that the present invention directly and effectively deters and virtually eliminates bending and tilting of leadframe leads during encapsulant transfer.

Another advantage of the present invention is that the pressure of the encapsulant flow during the molding process of the semiconductor package, rather than disturbing the leads, actually powers the leads in the desired direction toward the exterior surface of the package body.

Accordingly, a major advantage of the present invention is that the leads are properly positioned and exposed on the finished semiconductor package.

Yet another advantage of the present invention is that the encapsulant guides can be used on the outer leads as well as the inner leads, particularly as dimensions continue to diminish and the need develops for assisting the outer leads as well.

Accordingly, it is a significant advantage of the present invention that the encapsulant guides can in fact be used on any desired lead configurations and arrangements according to the needs and preferences at hand.

Another advantage of the present invention is that the encapsulant guides can be located wherever appropriate on the leads, not necessarily just at the lead tips.

Still another advantage of the present invention is that more than one encapsulant guide can be provided on each lead as may be needed or desired.

Another significant advantage of the present invention is that it thus enables and supports continuing reductions in lead and leadframe dimensions, along with continuing increases in lead counts, while concurrently improving production yields and manufacturing efficiencies.

Yet another important advantage of the present invention is that it valuably supports and services the historical trend of reducing costs, simplifying systems, and increasing performance.

These and other valuable aspects of the present invention consequently further the state of the technology to at least the next level.

Thus, it has been discovered that the leadframe with encapsulant guide method and apparatus of the present invention furnish important and heretofore unknown and unavailable solutions, capabilities, and functional advantages for fabricating encapsulant tolerant and encapsulant distortion-resistant leadframes, and for fabricating leadless semiconductor packages therefrom. The resulting processes and configurations are straightforward, economical, uncomplicated, highly versatile and effective, can be implemented by adapting known technologies, and are thus fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hitherto fore set forth herein or shown in the accompanying drawings are to be interpreted in an illustrative and non-limiting sense.

What is claimed is:

1. A method for fabricating a leadframe with encapsulant guide, comprising:
    forming a die attach paddle;
    forming leads around at least portions of the die attach paddle; and
    forming encapsulant guides angled on a plurality of the leads to push the leads outwardly when an encapsulant flows therepast.

2. The method of claim 1 wherein forming leads further comprises forming inner and outer leads around the die attach paddle.

3. The method of claim 1 wherein forming encapsulant guides further comprises etching the leads.

4. The method of claim 1 further comprising encapsulating the leadframe with at least portions of the tips of the leads exposed on at least one exterior surface of the encapsulant.

5. The method of claim 1 wherein forming the leads further comprises forming at least some of the leads along at least a portion thereof to be broader on the top than on the bottom thereof.

6. A method for fabricating a leadframe with encapsulant guide, comprising:
    forming a die attach paddle;
    forming leads around the periphery of the die attach paddle;
    forming encapsulant guides integral with and angled on the tips of a plurality of the leads to push the leads outwardly when an encapsulant flows therepast;
    attaching a semiconductor device to the die attach paddle;
    connecting lead wires between the semiconductor device and at least some of the leads; and
    encapsulating at least portions of the die attach paddle, semiconductor device, lead wires, and leads.

7. The method of claim 6 wherein forming leads further comprises forming inner and outer leads around the periphery of the die attach paddle.

8. The method of claim 6 wherein forming encapsulant guides further comprises etching the tips of the leads.

9. The method of claim 6 further comprising encapsulating the leadframe with at least portions of the tips of the leads exposed on at least one exterior surface of the encapsulant.

10. The method of claim 6 wherein forming the leads further comprises forming at least some of the leads along at least a portion thereof to be broader on the top than on the bottom thereof.

11. A leadframe with encapsulant guide, comprising:
    a die attach paddle;
    leads around at least portions of the die attach paddle; and
    encapsulant guides angled on a plurality of the leads for pushing the leads outwardly when an encapsulant flows therepast.

12. The leadframe of claim 11 wherein the leads around the die attach paddle further comprise inner and outer leads around the die attach paddle.

13. The leadframe of claim 11 wherein the encapsulant guides further comprise etched leads.

14. The leadframe of claim 11 further comprising an encapsulant encapsulating the leadframe with at least portions of the tips of the leads exposed on at least one exterior surface of the encapsulant.

15. The leadframe of claim 11 wherein at least some of the leads along at least a portion thereof are broader on the top than on the bottom thereof.

16. A leadframe with encapsulant guide, comprising:
    a die attach paddle;
    leads around the periphery of the die attach paddle;
    encapsulant guides integral with and angled on the tips of a plurality of the leads for pushing the leads outwardly when an encapsulant flows therepast;
    a semiconductor device attached to the die attach paddle;

lead wires connected between the semiconductor device and at least some of the leads; and an encapsulant encapsulating at least portions of the die attach paddle, semiconductor device, lead wires, and leads.

17. The leadframe of claim 16 wherein the leads around the periphery of the die attach paddle further comprise inner and outer leads around the periphery of the die attach paddle.

18. The leadframe of claim 16 wherein the encapsulant guides further comprise etched tips on the leads.

19. The leadframe of claim 16 further comprising an encapsulant encapsulating the leadframe with at least portions of the tips of the leads exposed on at least one exterior surface of the encapsulant.

20. The leadframe of claim 16 wherein at least some of the leads along at least a portion thereof are broader on the top than on the bottom thereof.

* * * * *